United States Patent
Yu et al.

(10) Patent No.: US 6,593,220 B1
(45) Date of Patent: Jul. 15, 2003

(54) ELASTOMER PLATING MASK SEALED WAFER LEVEL PACKAGE METHOD

(75) Inventors: Hsiu-Mei Yu, Hsin-Chu (TW); Ken-Shen Chou, Hsin-Chu (TW); Hsiu-Chieh Cheng, Chu-Bei (TW); Shun-Liang Hsu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/038,388

(22) Filed: Jan. 3, 2002

(51) Int. Cl.$^7$ ................................................ H01L 21/44
(52) U.S. Cl. ...................... 438/612; 438/613; 438/614; 438/615; 228/180.22
(58) Field of Search ................................ 438/106, 108, 438/612, 613, 614, 615, 622, FOR 343, FOR 349; 29/840, 842, 843, 844; 228/180.22, 180.21

(56) References Cited

U.S. PATENT DOCUMENTS

| | | | |
|---|---|---|---|
| 4,827,326 A | * 5/1989 | Altman et al. | 257/759 |
| 5,767,010 A | 6/1998 | Mis et al. | 438/614 |
| 5,937,320 A | 8/1999 | Andricacos et al. | 438/614 |
| 5,943,597 A | * 8/1999 | Kleffner et al. | 438/613 |
| 5,946,590 A | * 8/1999 | Satoh | 438/613 |
| 5,994,152 A | 11/1999 | Khandros et al. | 436/617 |
| 6,077,726 A | * 6/2000 | Mistry et al. | 438/108 |
| 6,197,613 B1 | * 3/2001 | Kung et al. | 438/106 |
| 6,372,545 B1 | * 4/2002 | Fan et al. | 438/108 |
| 6,426,821 B1 | * 7/2002 | Price et al. | 359/156 |
| 6,489,229 B1 | * 12/2002 | Sheridan et al. | 438/614 |
| 6,492,198 B2 | * 12/2002 | Hwang | 438/108 |
| 2002/0076913 A1 | * 6/2002 | Lee | 438/614 |
| 2002/0111009 A1 | * 8/2002 | Huang et al. | 438/613 |

FOREIGN PATENT DOCUMENTS

| | | | | |
|---|---|---|---|---|
| JP | 63314852 A | * 12/1988 | ............ | H01L/21/92 |
| JP | 01012553 A | * 1/1989 | ............ | H01L/21/92 |
| JP | 01015956 A | * 1/1989 | ............ | H01L/21/92 |
| JP | 64002339 A | * 1/1989 | ............ | H01L/21/92 |
| JP | 02125621 A | * 5/1990 | ......... | H01L/21/321 |
| JP | 03101233 A | * 4/1991 | ......... | H01L/21/321 |
| JP | 03191527 A | * 8/1991 | ......... | H01L/21/321 |
| JP | 04030533 A | * 2/1992 | ......... | H01L/21/321 |
| JP | 04094131 A | * 3/1992 | ......... | H01L/21/321 |
| JP | 05055228 A | * 3/1993 | ......... | H01L/21/321 |

\* cited by examiner

*Primary Examiner*—David L. Talbott
*Assistant Examiner*—Alonzo Chambliss
(74) *Attorney, Agent, or Firm*—George O. Saile; Stephen B. Ackerman

(57) ABSTRACT

A new method is provided for the creation of a solder mask for solder bump formation. A passivation layer is deposited on the semiconductor surface in the surface of which a contact pad has been provided, an opening is created in the layer of passivation that partially exposed the surface of the contact pad. A layer of UBM metal is deposited and patterned, limiting the layer of UBM to overlying and contacting the contact pad of the solder bump. A layer of elastomer is blanket deposited over the surface and patterned, creating an opening overlying the opening created in the layer of passivation, exposing the layer of UBM. The exposed surface of the layer of UBM is electroplated with a layer of solder, using the opening created in the layer of elastomer as the self-aligned electroplating opening. A step of reflow of the electroplated solder and the layer of elastomer completes the process of the invention, creating a solder bump surrounded by a layer of cured elastomer. Solder flow and elastomer curing are performed in the same step, and a special UBM design is used for the exposure of the UBM pad.

37 Claims, 3 Drawing Sheets

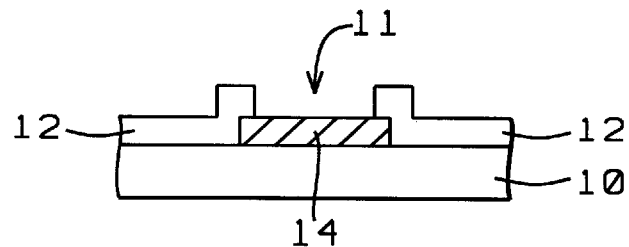
FIG. 1 - Prior Art
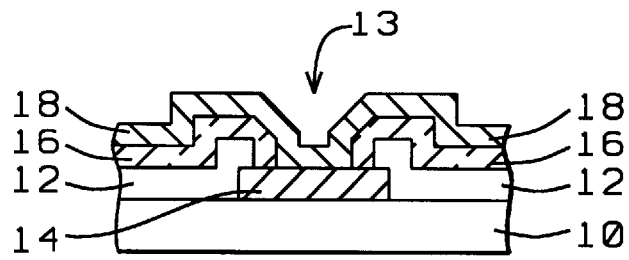
FIG. 2 - Prior Art
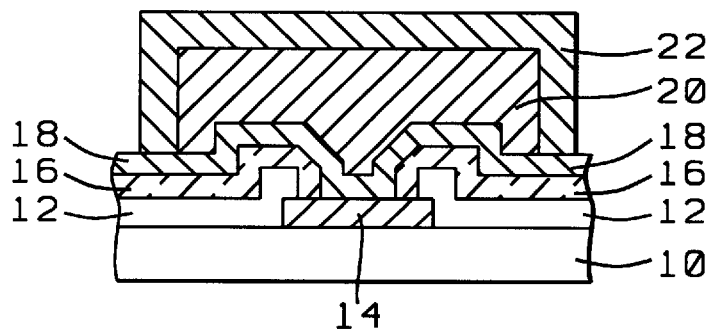
FIG. 3 - Prior Art
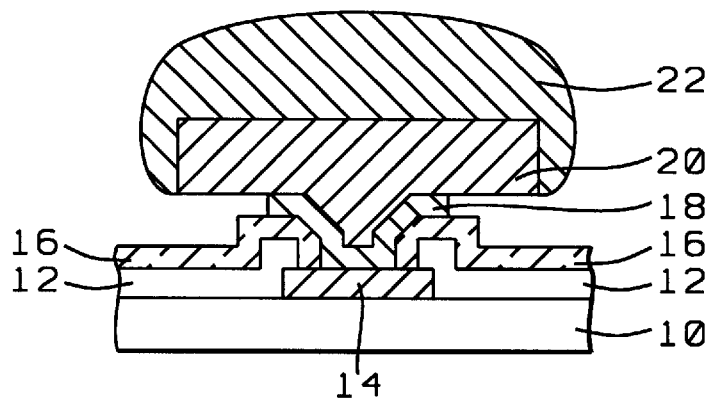
FIG. 4 - Prior Art

ELASTOMER PLATING MASK SEALED WAFER LEVEL PACKAGE METHOD

BACKGROUND OF THE INVENTION (1) Field of the Invention

The invention relates to the fabrication of integrated circuit devices, and more particularly, to a method for bump electroplating using an elastomer mask.

(2) Description of the Prior Art

Semiconductor device performance improvements have since the inception of the semiconductor technology been achieved by reducing device and device feature dimensions, establishing shorter paths of electrical signal propagation. Device product improvements by device miniaturization have by necessity led to increasing device packaging density. Increased device density is typically implemented internally to the device, by creating device features of smaller dimensions. For devices that must be assembled into complete device packages, the completed semiconductor devices are frequently assembled in multi-device packages. This has led to the field of high density interconnect technology, mounting multilayer structures on the surface of a substrate and connecting integrated circuits to one another. This approach results in high wiring and high packaging density, whereby many integrated circuit chips are physically and electrically interconnected and connected to a single substrate commonly referred to as a multi-chip module (MCM). Electrical device isolation is provided by layers of dielectric, such as polyimide, that separate various functional planes (such as signal lines, power lines and ground planes) in a substrate. Metal interconnects can be provided by metal lines that are embedded in other layers of dielectric, using vias to provide electrical connections between the interconnect lines that are located in adjacent and overlying surfaces. Interconnect lines must thereby be connected in such a manner that optimum performance can be realized for the completed package. For instance, adjacent layers must be formed such that primary signal propagation directions are orthogonal to each other. This approach avoids crosstalk between closely spaced lines, which can induce false signals and noise between the adjacent lines. Good planarity must also be maintained between adjacent layers of interconnect lines. Metal interconnect lines are typically narrow in width and thick in a vertical direction (in the range of 5 to 10 microns thick) and must be patterned with microlithography. Patterned layers must therefore be substantially flat and smooth (i.e. have good planarity) so that these layers can serve as a base for overlying layers.

In making interconnections between sub-components of a semiconductor device, two types of interconnections can be distinguished. The connection that is made with the intent that this connection is relatively permanent and the connection that is making with the intent that this connection provides easy entry and removal of a component. As examples of the first method of interconnections serve solder joints and wire bond interconnects. The second type of interconnect can be exemplified by components that are inserted into a receptor socket from where these components can be readily removed. The receptor medium for such interconnects typically comprises tension loaded contact springs into which the contact pins of the guest component are inserted. One of the main considerations for both methods of establishing electrical contact between separate components is the number of pins (input/output pins or I/O count) that can be maintained in going from one package to the next. Maximizing the I/O count for these applications is a prime requirement, this driven by and to accommodate the previously mentioned increase in device packaging density.

One of the original approaches that has been used to create surface mounted, high pin count integrated circuit packages has been the use of Quad Flat Packs (QFP's) with various pin configurations. For QFP's, closely spaced leads along the four edges of the flat package are used for making electrical connections from where the electrical connections are distributed to the surrounding circuitry. The input/output connections that can be made to QFP packages are therefore confined to the edges of the flat package, which limits the number of I/O connections that can be made to the QFP even in applications where the pin to pin spacing is small. QFP's have found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package, eliminating the restriction of having I/O connects only around the periphery of the package. More contact points with greater spacing between the contact points can therefore be allocated across the BGA package than was the case with the QFP's. The contact points that are used for the BGA package are typically solder balls that have the added advantage of facilitating flow soldering of the package onto a printed circuit board.

A Ball Grid Array (BGA) is an array of solderable balls placed on a chip carrier, such as a Printed Circuit Board (PCB). The balls contact a printed circuit board in an array configuration where, after reheat, the balls connect the chip to the printed circuit board. BGA's are known with 40, 50 and 60 mil spacings in regular or staggered array patterns. The BGA package is part of a larger packaging approach that is often referred to as Chip Scale Packages (CSP), which is a packaging approach that is considered to be different from the previously highlighted approach of MCM's.

Flip Chip packages have in general been used to accommodate increased I/O count combined with increased requirements for high performance IC's. Flip chip technology fabricates bumps (typically Pb/Sn solder) on metal pads and interconnects the bumps directly to the package media, which are usually ceramic or plastic based. The flip-chip is bonded face down to the package through the shortest paths. This approach can be applied to single-chip packaging and to higher, integrated levels of packaging (in which the packages are larger) and to more sophisticated packaging media that accommodate several chips to form larger functional units.

For the packaging of semiconductor devices, the package in which the devices are contained provides protection of the device from environmental influences such as mechanical (surface) damage or damage caused by moisture or other chemical substances that may effect exposed surfaces of the device. Part of the package design includes the design of conductive interfaces that enable the device to be electrically interconnected with surrounding circuitry. Increased device density has not only created new demands on input/output connections of the device but has also caused considerably more energy (in the form of heat) to be expanded per cubic volume content of the device. This has resulted in increased demands placed on methods of heat exchange between the device and its surrounding and supporting surfaces. In many of the semiconductor device packages, the device is mounted in close physical proximity to a heat sink, which is often combined with providing paths of low thermal resistance between the device and the heatsink.

It is therefore the objective of providing a package for semiconductor devices, such as flip chips, that has a direct physical connection (contact) between the device and a substrate on the surface of which the device is mounted. In a typical device packaging arrangement, a substrate layer that contains multiple (for instance three) layers of interconnects, is used to connect the device to surrounding circuitry. Wire bond connections are made between the flip chip and the substrate layers. Contact points provided in or on the surface of the device make contact with contact points in the upper surface of the substrate layer, the substrate layer re-distributes (fan-out) the device electrical contact points. One of the approaches that have been used to create high thermal interchange between a device and a heatsink is to create one or more openings in the substrate layers. These openings are filled with a low-resistivity material, establishing electrical contact between one selected copper pad of the copper traces (in the upper layer of the substrate layer) and the heatsink. Connecting the ground point of the IC die to a selected copper pad of metal traces (of for instance copper) completes the ground path between the ground of the IC die and the heatsink. A molding is typically encased between the lower surface of the device and the upper surface of the substrate. This molding is referred to as underfill since it is filled in under the original semiconductor device. A heat sink is typically attached to a surface of the device.

A typical method of packaging a semiconductor device such as a BGA/flip chip provides a heatsink as major part of the package, the heatsink has a surface that is electrically conductive. The semiconductor chip takes up the center of the package while contact points to the die are closely spaced around the periphery of the die. A cavity is provided in the heatsink, the die is mounted inside the cavity. The upper surface of the IC chip is mounted in close physical contact with the heatsink, typically via a thin adhesive layer of thermally conductive epoxy that is deposited over the top surface of cavity. Contact points of the die are conductively bonded, using wire-bonding techniques, to a contact points in or on the surface of a (containing one or more layer of interconnect lines) substrate layer that is also attached to the heatsink.

A typical semiconductor device package can contain a substrate (of for instance three layers), an adhesive layer that directly connects the substrate layer to the heatsink, a stiffener that provides rigidity to the substrate layer and a layer of copper traces that further interconnects the solder balls (on a surface of the substrate) to surrounding circuitry. Wire bond connections are provided between contact points on the IC die and copper traces contained in a layer of the substrate. The IC die can further be encapsulated using an encapsulation material that is syringe dispensed to surround the die, forming an encapsulation layer, including the bond wires. The encapsulation layer is cured after injection.

Other methods of encapsulating a semiconductor device provide a heatsink that overlays the semiconductor device. The semiconductor device is mounted on the surface of a substrate by means of a layer of epoxy. Gold bond wires can connect electrical contact points that are provided in the upper surface of the device to the substrate, contact balls are provided in or on the lower surface of the device for additional connections (typically for high frequency signal transfer) between the device and the substrate. A molding compound is used to encapsulate the die and the bond wires, providing environmental protection to the die. By making high heat conductivity connections with the bottom of the die, heat generated in the die can be transferred from the die to the substrate. For applications where additional heat must be removed from the semiconductor die, the molding compound that encapsulates the die can be partially removed from above the upper surface of the die, partially exposing this upper surface. This exposed portion of the upper surface of the die can then be brought in direct physical contact with a heatsink the overlays the semiconductor die. The heatsink is typically formed such that it also can be attached to the underlying substrate, resulting in a mechanically strong package. Where necessary, the heat sink in turn can be encapsulated in a molding compound that now forms the upper surface of the package, the largest area of contact between the molding compound and the package being the upper surface of the heatsink.

Of the above highlighted aspects of creating a semiconductor device packager, preferably a flip chip device package, the invention addresses a method of forming a contact bump in or on a semiconductor surface. The invention addresses concerns of package cost, the need for underfill and stress relieve, improving device yield and reliability.

FIG. 1 shows an example of one of the methods that can be used to create an interconnect bump. A semiconductor surface 10 has been provided with a metal contact pad 14, the semiconductor surface 10 is protected with a layer 12 of passivation. An opening 11 has been created in the layer 12 of passivation, the surface of the metal contact pad 14 is exposed through this opening 11. Next, FIG. 2, a dielectric layer 16 is deposited over the surface of the layer 12 of passivation. The layer 16 of dielectric is patterned and etched creating an opening 13 in the layer 16 of dielectric that aligns with the metal pad 14 and that partially exposes the surface of the metal pad 14. A layer of 18 of metal, FIG. 3, typically created by applying Under Bump Metallurgy (UBM), is created over the layer 16 of dielectric, this layer 18 of metal is in contact with the surface of the metal pad 14 inside opening 13. The region of layer 18 of metal that is above the metal pad 14 will, at a later point in the process, form a pedestal over which an interconnect bump will be formed. This pedestal can be further extended by the deposition and patterning of one or more additional layers (underlying the pedestal) that may contain a photoresist or a dielectric material. These additional layers have not been shown in FIG. 1 but essentially have the shape of layer 16 and can be removed during one of the final processing steps that are applied for the formation of the interconnect bump.

A layer 20 of metal such as copper, FIG. 3, that forms an integral part of the to be created interconnect bump, is next electroplated on the surface of the layer 18 of metal whereby the layer 18 serves as the lower electrode during the plating process. The final layer 22 of solder is electroplated on the surface of layer 20.

The layer 18 of metal is next etched, FIG. 4, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 4, these layers are also removed at this time.

A solder paste or flux is now applied to the layer 22 of solder, the solder 22 is melted in a reflow surface typically under a nitrogen atmosphere, creating the spherically shaped interconnect bump 22 that is shown in FIG. 4.

The above processing steps are in many of the applications of the indicated process augmented by processing steps of curing and pre-baking in order to improve hardness and other desirable performance parameters of the various layers that are used for the processing sequence that has been described in FIGS. 1 through 4. For instance, a layer of photoresist that is used as part of the processing sequence can be pre-baked prior to the exposure and etching of the photoresist layer. These steps have not been included in the above description for reasons of simplicity of description.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes such as the improvement of adhesion of the various overlying layers or the prevention of diffusion of materials between adjacent layers. These layers collectively form layer 18 of FIG. 2 and have, as is clear from the above, an effect on the shape of the completed bump and are therefore frequently referred to as Ball Limiting Metal (BLM) layer. Frequently used BLM layers are successive and overlying layers of chrome, copper and gold whereby the chrome is used to enhance adhesion with an underlying aluminum contact pad, the copper layer serves to prevent diffusion of solder materials into underlying layers while the gold layer serves to prevent oxidation of the surface of the copper layer. The BLM layer is represented by layer 18 of FIGS. 2 through 4.

U.S. Pat. No. 5,994,152 (Khandros et al.) show a mask 464 for bump electroplating (FIG. 4c).

U.S. Pat. No. 5,937,320 (Andricacos et al.) show a bump process using a UMB and electroplating process.

U.S. Pat. No. 5,767,101 (Mis et al.) show a related bump process.

SUMMARY OF THE INVENTION

A principle objective of the invention is to provide a method to reduce the cost and increase the reliability of creating a solder bump on a semiconductor surface.

Another objective of the invention is to provide a method of creating a solder bump that eliminates the need for underfill in the semiconductor device package, enabling and significantly facilitating the process of rework of a completed flip chip package.

Yet another objective of the invention is to reduce internal stress of a flip chip package after the package has been completed, improving yield and reliability of the semiconductor device package.

A still further objective of the invention is to provide a method that uses elastomer as the masking material for the processing step of electroplating during the processing sequence of creating a solder bump on a semiconductor surface.

A still further objective of the invention is to remove the need of using liquid film or dry film to form the electroplating mask, reducing the material that is required for the creation of an electroplating mask, further removing the need for costly and time consuming materials after the electroplating mask has been formed.

A still further objective of the invention is to provide a method for forming an electroplating mask that is suited for fine-pitch solder bumps and that is therefore suited for sub-micron technology.

In accordance with the objectives of the invention a new method is provided for the creation of a solder mask for solder bump formation. A passivation layer is deposited on the semiconductor surface in the surface of which a contact pad has been provided, an opening is created in the layer of passivation that partially exposed the surface of the contact pad. A layer of UBM metal is deposited and patterned, limiting the layer of UBM to overlying and contacting the contact pad of the solder bump. A layer of elastomer is blanket deposited over the surface and patterned, creating an opening overlying the opening created in the layer of passivation, exposing the layer of UBM. The exposed surface of the layer of UBM is electroplated with a layer of solder, using the opening created in the layer of elastomer as the self-aligned electroplating opening. A step of reflow of the electroplated solder and the layer of elastomer completes the process of the invention, creating a solder bump surrounded by a layer of cured elastomer.

Key points of the objectives of the invention are:
1. solder flow and elastomer curing are performed in the same step, and
2. a special UBM design is used for the exposure of the UBM pad.

BRIEF DESCRIPTION OF THE DRAWINGS

FIGS. 1 through 4 show a cross section of a prior art processing sequence to form interconnect bumps, as follows:

FIG. 1 shows a cross section of a semiconductor surface on the surface of which a contact pad has been created, the semiconductor surface is covered with a patterned layer of passivation.

FIG. 2 shows the cross section of FIG. 1 after a patterned layer of dielectric and a layer of metal have been created on the semiconductor surface.

FIG. 3 shows a cross section of FIG. 2 after a layer of interconnect metal and a layer of solder compound have been selectively deposited.

FIG. 4 show a cross section after excessive layers have been removed from the semiconductor surface and after the solder has been flowed forming the interconnect bump.

FIG. 5 shows a cross section of a semiconductor surface in which a contact pad has been provided, a layer of passivation has been deposited and patterned, partially exposing the surface of the contact pad, a layer of UBM metal has been deposited over the surface of the layer of passivation, including the opening created in the layer of passivation.

FIG. 6 shows a cross section after the layer of UBM has been patterned and etched.

FIG. 7 shows a cross section after a layer of elastomer has been deposited and patterned, creating an opening that overlays the etched layer of UBM metal.

FIG. 8 shows a cross section after a layer of solder has been electroplated, creating the body of the solder bump.

FIG. 9 shows a cross section after the layer of elastomer and the electroplated layer of solder have been subjected to the process of reflow, creating the solder bump of the invention.

DESCRIPTION OF THE PREFERRED EMBODIMENTS

Figure 5:
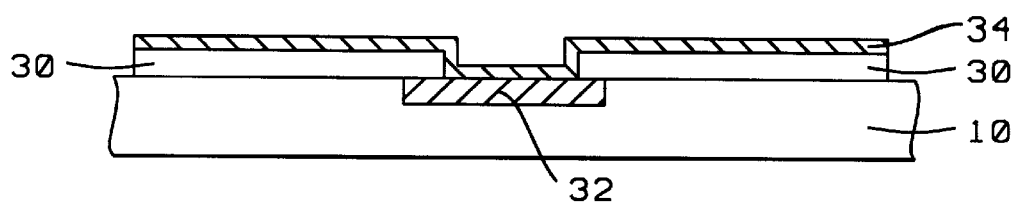
FIGS. 5 through 9 show the process of the invention, as follows.

In Flip-Chip technology, solder bump technology can be broken down into three methods, that is:

1. Solder ball mounting, for ball size larger than 16 mil (400 μm)
2. Stencil printing, for ball size larger than 12 mil (300 μm), and
3. Electroplating plating, for ball size smaller than 2 mil (50 μm).

Of these three 3 methods, electroplating is the most expensive process, electroplating however is a process where fine pitch I/O bumps can be created. In view of the above indicated increase in device density and the therefrom following increase in required I/O count, the electroplating method is expected to become the major technology for high I/O count, fine pitch IC applications. The traditional electroplating process uses a liquid photoresist (that is spin coated over the surface) or a dry film photoresist (that is laminated over the surface) as a plating mask. Both methods of forming the plating mask consume a significant amount of materials. In addition, after the process of electroplating has been completed, the photoresist needs to be removed, which is a time consuming and costly process.

The invention therefore uses an elastomer material, such as for instance liquid polymer, as the masking material of the electroplating process. The masking pattern is formed on the surface of the substrate by applying conventional methods of photolithography. An alternative method is to apply the elastomer by lamination. Vias are formed in the layer of elastomer that align with required points of electrical contact in the surface of the substrate. The layer of elastomer layer can be deposited to a thickness of about 0.20 to 1.2 times the height of the bump that is to be created and is determined by product requirements.

With the elastomer mask of the invention, current technology is available where uniform current densities can be established over the surface of the wafer. Where, for requirements of critical device connections or unusual I/O pad designs, the height of the created bumps is not uniform across the face of the substrate, uniformity can be enforced by Chemical Mechanical Polishing (CMP) of the created bumps.

After the electroplating has been completed, the deposited solder together with the elastomer mask is cured simultaneously during the reflow process, forming a stable and elastic stress buffer layer under the bumps. The layer of elastomer will absorb the stress due to CTE (Coefficient of Thermal Expansion) mismatch between the chip and the attached Printed Circuit Board (PCB), resulting in a significant improvement in package yield and reliability.

With the layer of elastomer in place and serving as a stress release buffer, the need for IC die underfill is eliminated. The process of package rework, where the die has to be removed from the surface of the substrate, is now possible and is a simple process. The cost that is incurred during typical flip chip assembly is therefore significantly reduced due to the invention.

The following paragraphs will provide further details relating to the technologies of electroplating and evaporation as they apply to the processes of forming interconnect bumps.

The method of electroplating follows the processing steps of (over the surface of a substrate wherein a point of electrical contact, typically containing aluminum, has been provided, all steps of processing being centered around this point of electrical contact) depositing a layer of polyimide and etching an opening in this layer of polyimide that aligns with the point of contact, depositing (by vacuum evaporation) a layer of Under Bump Metallurgy (UBM, also referred to as Ball Limiting Metallurgy or BLM) over the layer of poly including the opening created in the layer of poly. A layer of photoresist is deposited over the layer of UBM and patterned, creating an opening in the layer of photoresist that aligns with that part of the layer of UBM that must remain in place under the to be created solder bump. Next a layer of metal (typically copper) is electroplated over the layer of photoresist whereby the layer of UBM serves as the common electrode for the electroplating process, the electroplated metal is in contact with the layer of UBM. A layer of solder is next plated over the layer of electroplated metal. The layer of electroplated metal is centered on the opening that has been created in the layer of photoresist, as is the layer of plated solder. The photoresist is removed using the solder bump as a mask, the layer of UBM is selectively etched and removed where this layer does not underlie the to be created solder bump in order to electrically isolate adjacent solder bumps from each other. The critical step of the process is performed as a final step whereby a flux is applied to the plated solder and the solder is melted in a reflow furnace under a nitrogen atmosphere, creating a spherically shaped solder bump. The above summarized processing steps of electroplating that are used for the creation of a solder bump are supplemented by the step of curing or pre-baking of the layer of photoresist after this layer has been deposited over the layer of UBM.

The process of evaporation also starts with a semiconductor surface wherein a metal point of contact has been provided. A layer of passivation is deposited and patterned, creating an opening in the layer of passivation that aligns with the metal point of contact. A layer of UBM (this layer may be a composite layer of metal such as chromium followed by copper followed by gold in order to promote improved adhesion (with the chromium) and to form a diffusion barrier layer or to prevent oxidation (the gold over the copper)) is formed over the layer of passivation and inside the opening created in the layer of passivation. Solder is next selectively plated over the deposited layer of UBM and melted in a solder reflow surface in a hydrogen ambient for solder reflow, in this manner forming the spherically shaped solder bumps.

Referring now specifically to FIG. 5, there is shown a cross section of a semiconductor surface 10 in which a contact pad 32 has been provided, a layer 30 of passivation has been deposited, patterned and etched partially exposing the surface of the contact pad 32, a layer 34 of UBM metal has been blankly deposited over the surface of the layer 30 of passivation.

In addition to the layers that are shown in FIG. 5, the surface of contact pad 32 can be in-situ sputter cleaned (not shown in FIG. 5) after the layer 30 of passivation has been etched.

Layer 10 is a semiconductor layer, a contact pad 32 has been created in or on the surface of layer 10. Layer 10 will typically comprise the surface of a semiconductor substrate, printed circuit boards, flex circuits or a metallized or glass substrate or semiconductor device mounting support. A contact pad 32 has been created on the surface of layer 10, electrical contact must be established with contact pad 32 by means of an overlying solder bump. Contact pad 32 serves as interface between the solder bump and electrical interconnects that are provided in the surface of layer 10.

A layer 30 of passivation that may, for instance, contain Plasma Enhanced silicon nitride (PE $Si_3N_4$), is deposited over the surface of layer 10 and of contact pad 32.

Insulating/passivation layers such as silicon oxide and oxygen-containing polymers are deposited over the surface of various layers of conducting lines in a semiconductor device or substrate to separated the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip package, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited that further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, passivation layer can be a photosensitive polyimide or can comprise titanium nitride. Another material often used for passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross linked thereby leaving unexposed regions (that are not cross linked) over the bonding pads. During subsequent development, the unexposed polyimide precursor layer (over the bonding pads) is dissolved thereby providing openings over the bonding pads. A final step of thermal curing leaves a permanent high quality passivation layer of polyimide over the substrate.

The preferred material of the invention for the deposition of layer 30 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 34 of PE $Si_3N_4$ can be deposited to a thickness between about 200 and 800 Angstrom.

Layer 30 of PE $Si_3N_4$ is next patterned and etched to create an opening in the layer 30 that overlays and aligns with the underlying contact pad 32.

The etching of layer 30 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 30 can also use $He/NF_3$ as an etchant at a temperature of between about 80 and 100 degrees C. and a pressure of between about 1.20 and 1.30 Torr for a time of between about 20 and 30 seconds using a dry etch process.

Layer 34 of UBM has been deposited by vacuum evaporation, this layer is as yet to be patterned and etched. Layer 34 may contain multiple layers of metal such as the previously cited layers of chrome, followed by a layer of copper, followed by a layer of gold. Layer 34 of UBM can be deposited to a thickness between about 200 and 800 Angstrom.

A seed layer (not shown in FIG. 5) can at this time be deposited over the surface of the layer 34 of Under Ball Metallurgy. Any of the conventional metallic seed materials can be used for this step. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Figure 6:
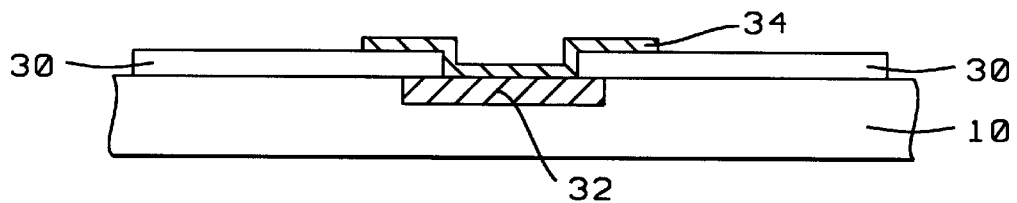

Referring now to FIG. 6, there is shown a cross section of semiconductor surface 10 after the layer 34 of UBM has been patterned and etched, partially exposing the surface of the passivation layer 30. It must be noted that the etched layer of UBM overlays and makes contact with the contact pad 32 and has a surface area that aligns with and is limited to the immediate vicinity of the contact pad 32. The etched layer 34 of UBM metal is the base over which the solder bump that connects to contact pad 32 is to be created.

Figure 7:
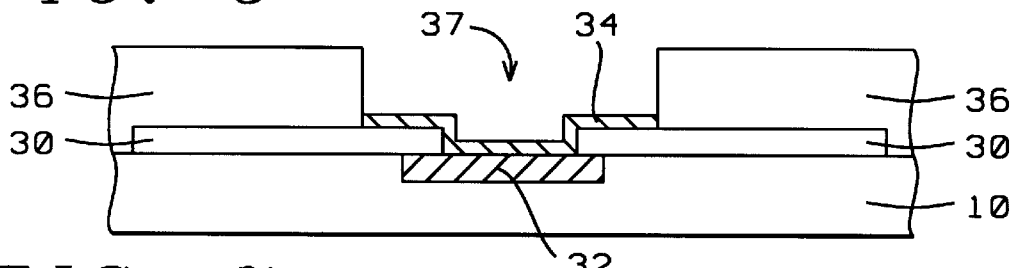

After the layer 34 of UBM has been etched, a layer 36, FIG. 7, of elastomer is deposited over the surface of the layer 30 of passivation, this layer is patterned and etched to create an opening 37 in layer 36 that aligns with contact pad 32. Disposable solid layers that are used in semiconductor technology generally comprise a polymer, preferably photoresist, but can also be polymers such as polyimide, parylene, Teflon or benzo-cyclo-butene (BCB). Elastic insulation film can be formed of a polyimide resin or of a silicone resin. Typically, metal power and ground planes in a substrate are separated by layers of a dielectric such as a polyimide.

The preferred material for the layer 36 is an elastomer, which is a polymer ($SiCl_xO_y$). Polymer compositions can contain silicons, carbons, fluoride, chlorides, oxygens, and benzo-cyclo-butene (BCB). The term polymer is however used to describe as grab bag of chemicals that have been deposited or accumulated (for instance on the sidewalls of a etch chamber).

A polymer film can be spun onto the wafer and can contain polycarbonate (PC), polystyrene (PS), polyoxides (PO), polymethylmethacrylate (PPMA) and polypolyoxides (PPO). It is important to use a material for the polymer film that can be applied by spin coating and that can, at a later date, be easily removed by dipping the coated semiconductor package in a solvent. Solvents that can be used for this purpose include acetone, THF and trichloromethane.

Typical insulating materials that can be used contain silicon oxide and oxygen-containing polymers. Typical insulator deposition uses LPCVD or APCVD at a temperature between about 400 and 500 degrees C. or PECVD at a temperature between about 300 and 450 degrees C. whereby the insulator material is deposited to a thickness of between about 2000 and 10000 Angstrom.

Conventional polymers have a number of attractive characteristics for their application in a semiconductor device structure such as the ability to fill openings of high aspect ratio, a relatively low dielectric constant (about 3.2), a simple process required for the depositing of a layer of polymer, the reduction of sharp features or steps in the underlying layer, high temperature tolerance of cured polymer. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross linked thereby leaving unexposed regions (that are not cross linked) over the bonding pads. During subsequent development, the unexposed polymer precursor layer (over the bonding pads) is dissolved thereby providing openings over the bonding pads. A final step of thermal curing leaves a permanent high quality passivation layer of polymer over the substrate.

This step of coating of the layer 36 of polymer is performed at room temperature and ambient pressure for a time of between about 30 and 40 seconds. The indicated processing parameters are not critical since the polymer thickness is controlled by spin speed.

The layer 36 of elastomer serves as the masking layer for the deposition of a solder compound that makes contact with the etched UBM layer 34. The surface of layer 36 of elastomer is exposed to UV light to define the opening 37, the elastomer 36 that is not exposed to the UV light is removed during developing of the elastomer. The unexposed elastomer is removed during developing with a solvent, no elastomer etching is required.

The remaining (after develop) elastomer can be cured to cross-link in order to protect the device circuitry. This step is a high temperature cure, typically at 350 degrees C. for 120 minutes.

The methods that can be used to form layer 36 of elastomer can be summarized as follows:

1) a layer of liquid elastomer can be spun over the surface of the passivation layer, including the surface of the etched layer of UBM. The opening 37 is formed in the layer 36 of elastomer using conventional methods of photolithography.

2) a dry film of elastomer can be laminated over the surface of the passivation layer, including the surface of the etched layer of UBM. The opening 37 is formed in the layer 36 of elastomer using conventional methods of photolithography.

3) a patterned layer of elastomer can be applied by laminating as a tape film that is aligned with the contact pad 32 (providing an opening above the contact pad 32), laminated over the surface of the passivation layer, including the surface of the etched layer of UBM.

4) a patterned layer of elastomer can be applied by lamination as an elastomer film in which the via openings have already been formed (providing an opening above the contact pad 32), laminated over the surface of the passivation layer, including the surface of the etched layer of UBM.

It is important to further notice that the layer 36 of elastomer is deposited to a thickness of between about 0.25 and 0.75 the thickness of the height of the bump that is to be create. This height is critical and has been shown during simulation to provide optimum reliability.

Figure 8:
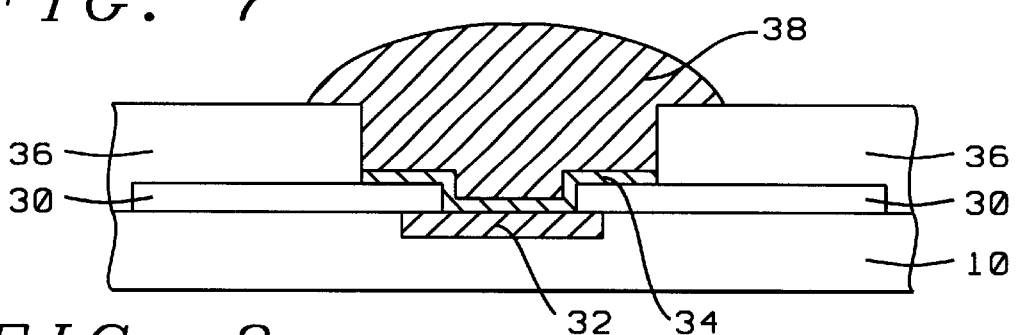

FIG. 8 shows a cross section of semiconductor surface 10 after a layer 38 of solder compound has been plated over the exposed surface of the layer 34 of UBM.

Optionally, the surface of layer 34 of UBM that is exposed inside opening 37 can be been electro plated using for instance Cu/Ni as a source creating a layer (not shown in FIG. 7) of electroplated Cu/Ni overlying the layer 34 of UBM. The electroplated layer is bounded by the etched layer 36 of elastomer. This process of electroplating is a precursor to the processing step of depositing solder alloys over the surface of the layer of UBM.

Figure 9:
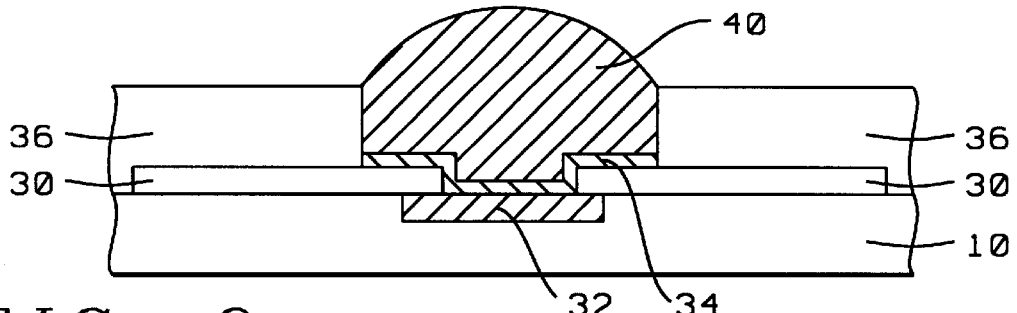

FIG. 9 shows a cross section of the semiconductor surface after a flux has been applied to the surface of solder layer 38 and the solder is cured in a reflow surface under a nitrogen atmosphere, forming the spherically shaped solder bump 40 that is shown in FIG. 9. At the time of the reflow process, the solder mask 36 of elastomer is cured while reflow of the solder layer 38 occurs. The cured layer of elastomer that underlies the solder bump forms a stable and elastic stress relieve buffer underlying the solder bump. The process of curing can be performed at a temperature of 350 degrees C. in a $N_2$ gas environment for a time of 20 hours and a pressure of 760 Torr.

It must further be pointed out that the invention, at the step where the layer of UBM is etched, can integrated this etch as part of a process of creating additional interconnect lines (re-routing process). The creating of the layer of UBM that underlies contact bumps (the etch of layer 34 in FIG. 5 that forms layer 34 of FIG. 6) can therefore become part of the process of forming interconnect lines. This formation of interconnect lines is not further illustrated in the drawings since this step can be readily understood without providing additional details.

Figure 10:
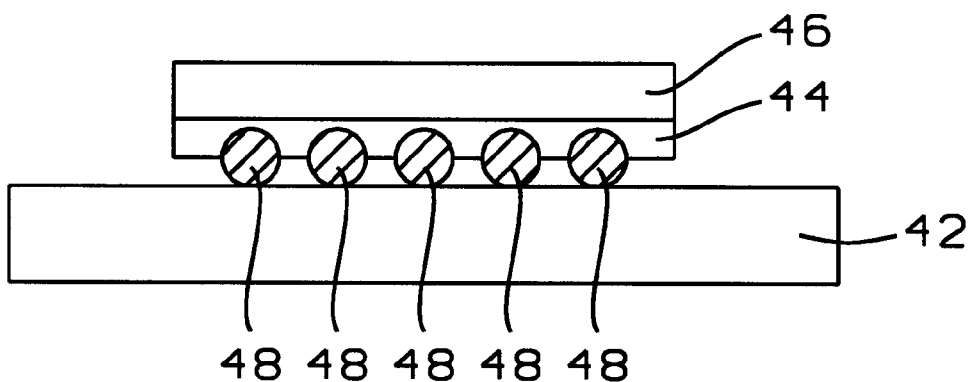
FIG. 10 shows a cross section of a semiconductor device on the surface of which have been created solder bumps using the invention, the device is mounted on the surface of a Printed Circuit Board.

FIG. 10 shows a cross section of a semiconductor device on the surface of which have been created solder bumps using the invention, the devices is mounted on the surface of a Printed Circuit Board. The highlighted details of FIG. 10 are the following:

42, the Printed Circuit Board on which the semiconductor device has been mounted 44, the layer of elastomer into which the contact bumps have been formed in accordance with the invention 46, the Integrated Circuit device 48, the contact bumps that have been created in accordance with the invention and that provide electrical interconnections between the semiconductor device 46 and electrical traces (not shown) in the PCB 42.

Figure 11:
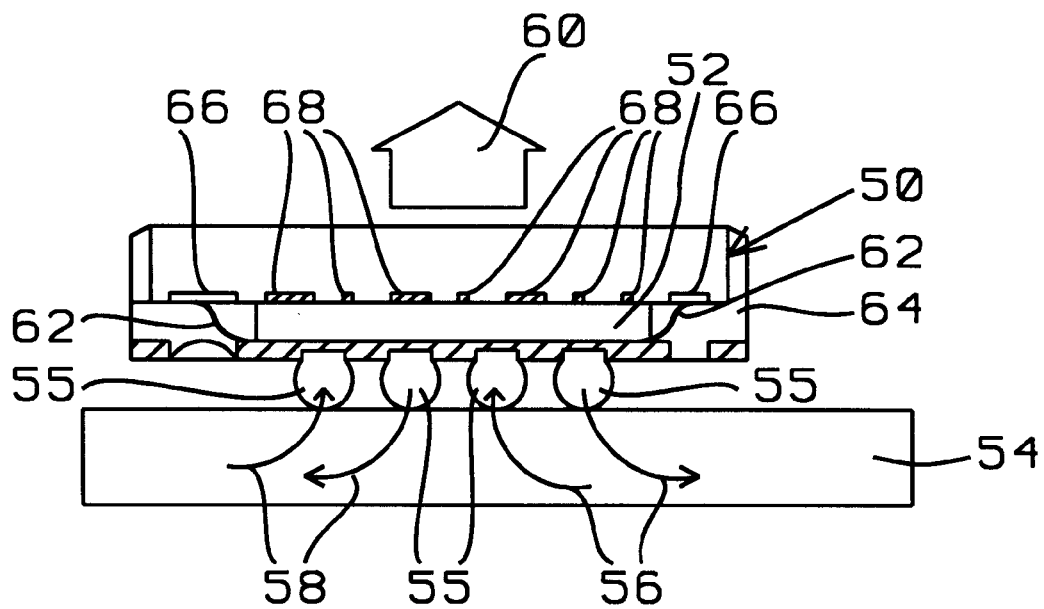
FIG. 11 shows a cross section of a semiconductor device, details have been provided relating to the package of the device.

FIG. 11 shows a cross section of a semiconductor device, the details that have been provided and that relate to the surrounding package of the device are as follows:

50, a semiconductor device 52, the layer of elastomer through which solder bumps are provided for connection to the semiconductor device 50

54, the PCB on the surface of which the semiconductor device 50 is mounted 55, the solder bumps that have been created in accordance with the invention and that provide the electrical interface between the PCB 54 and the IC 50 through the layer 52 of elastomer 56, interconnect lines such as signal distribution lines 58, interconnect lines such as power distribution lines 60, the major direction of the heat dissipation, away from the semiconductor device 50

62, the bond wires that connect the semiconductor device 50 to one or more solder bumps via interconnect traces (not shown) that have been provided on the active surface of the semiconductor device and that are etched at the same time that the UBM layer for the solder bumps are etched; this is a very important interconnect since it integrates, as previously indicated, UBM etching (to create layer 34, FIG. 6) with the etching of interconnect traces, also using UBM metal. Openings (not shown) are for this purpose created in the layer 52 of elastomer that interconnect the (UBM) metal traces to the active surface of the semiconductor device 50

64, an encapsulation of the semiconductor device 50

66, contact pads in the active surface of the semiconductor device 50 to which bond wires 62 are connected 68, contact pads in the active surface of the semiconductor device 50 to which the solder bums 55 of the invention are connected.

FIGS. 10 and 11 further emphasize that the layer of elastomer provides a stable and stress free buffer layer under the bumps that connect to the semiconductor device and that no underfill is required for the semiconductor device. Uniform current densities can be provided across the surface of the wafer by applying a CMP to the created solder bumps, planarizing the contact points of the bumps.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming solder bumps on a microelectronic device having a semiconductor substrate and a contact pad on said semiconductor substrate, wherein said contact pad has an exposed surface portion, said method comprising the steps of:

providing said semiconductor substrate, the surface of said substrate having been provided with a least one contact pad having a surface;

depositing a layer of passivation over the surface of said substrate including said exposed surface of said contact pad; patterning and etching said layer of passivation, partially exposing said surface of said contact pad;

depositing a conductive layer over the surface of said layer of passivation, including said partially exposed surface of said contact pad;

patterning and etching said conductive layer, removing said conductive layer from above said layer of passivation, partially exposing the surface of said layer of passivation, leaving said conductive layer in place above and extending from above said contact pad by a measurable amount, creating a conductive layer overlying said contact pad;

depositing a layer of elastomer over said partially exposed surface of said layer of passivation, including the surface of said conductive layer overlying said contact pad;

patterning and etching said layer of elastomer, creating an opening in said layer of elastomer that aligns with and exposes the surface of said conductive layer overlying said contact pad;

depositing a layer of solder or solder compound over the exposed surface of said conductive layer; and performing a process of reflow, simultaneously curing said deposited layer of solder or solder compound and said patterned and etched layer of elastomer.

2. The method of claim 1 wherein said layer of passivation comprises PE $Si_3N_4$ deposited to a thickness between about 200 and 800 Angstrom.

3. The method of claim 1 wherein said layer of passivation is selected from the group comprising the materials $SiO_2$, a photosensitive polyimide, phosphorous doped silicon dioxide and titanium nitride deposited to a thickness between about 200 and 800 Angstrom.

4. The method of claim 1 wherein said conductive layer comprises a layer of Under Bump Metallurgy comprises a layer of chromium followed by a layer of copper followed by a layer of gold.

5. The method of claim 4 wherein said layer of Under Bump Metallurgy comprises a plurality of sub-layers of different metallic composition.

6. The method if claim 4 wherein said depositing a layer of elastomer is applying a patterned layer of elastomer by laminating said elastomer as an elastomer film in which via openings have been formed over the surface of the passivation layer, including the surface of the etched layer of UBM.

7. The method of claim 1 wherein said elastomer comprises a polymer.

8. The method of claim 1 wherein said passivation layer deposited over the surface of said semiconductor surface comprises a plurality of passivation layers.

9. The method of claim 8 wherein at least one of said plurality of passivation layers is selected from a group comprising PE $Si_3N_4$, $SiO_2$, a photosensitive polyimide, phosphorous doped silicon dioxide and titanium nitride.

10. The method of claim 1 wherein said contact pad on said semiconductor surface is electrically connected with a semiconductor device with at least one conductive line of interconnect or with at least one conductive contact point.

11. The method if claim 1 wherein said depositing a layer of elastomer is applying a layer of liquid elastomer by spinning elastomer over the surface of the passivation layer including the surface of the etched layer of conductive material.

12. The method if claim 1 wherein said depositing a layer of elastomer is applying a dry film of elastomer laminated over the surface of the passivation layer, including the surface of the etched layer of conductive material.

13. The method if claim 1 wherein said depositing a layer of elastomer is applying a patterned layer of elastomer by laminating said elastomer as a tape film that is aligned with the contact pad, said lamination to occur over the surface of the passivation layer, including the surface of the etched layer of conductive material.

14. The method of claim 1 wherein said contact pad on said semiconductor substrate is further expanded to include a contact pad that is formed on a surface that is selected from a group of surfaces comprising printed circuit boards, flex circuits or a metallized or glass substrate or semiconductor device mounting support.

15. The method of claim 1 with the additional step of performing an in-situ sputter clean of said conductive layer overlying said contact pad, said additional step to be performed after said step of patterning and etching said layer of elastomer.

16. The method of claim 1 with the additional step of depositing a seed layer over the surface of said layer of conductive material, said additional step to be performed after said layer of conductive material has been deposited.

17. The method of claim 1 with the additional step of depositing a solder flux or paste over said deposited layer of solder or solder compound, said additional step to be performed after said layer of solder or solder compound has been deposited.

18. The method of claim 1 wherein said patterning and etching said conductive layer leaving said conductive layer in place above and extending from above said contact pad by a measurable amount is further expanded to simultaneously create conductive interconnect lines on the surface of said layer of passivation, said conductive interconnect lines to make contact with at least one contact pad on said semiconductor substrate by creating openings in said layer of passivation that align with at least one contact pad on said semiconductor substrate.

19. A method of forming solder bumps on a microelectronic device having a semiconductor substrate and a contact pad on said semiconductor substrate, wherein said contact pad has an exposed surface portion, said method comprising the steps of:

providing said semiconductor substrate, the surface of said substrate having been provided with a least one contact pad having a surface;

depositing one or more layers of passivation over the surface of said substrate including said exposed surface of said contact pad;

patterning and etching said on or more layers of passivation, partially exposing said surface of said contact pad;

depositing a conductive layer comprising Under Bump Metallurgy comprising one or more of sub-layers of different metallic composition over the surface of said one or more layers of passivation, including said partially exposed surface of said contact pad;

patterning and etching said conductive layer, removing said conductive layer from above said layer of passivation, partially exposing the surface of said layer of passivation, leaving said conductive layer in place above and extending from above said contact pad by a measurable amount, creating a conductive layer overlying said contact pad;

depositing a layer of elastomer or any other suitable polymer over said partially exposed surface of said one or more layers of passivation including the surface of said conductive layer overlying said contact pad by methods of spinning or dry film deposition or elastomer tape film deposition or by patterned layer of elastomer deposition;

patterning and etching said layer of elastomer, creating an opening in said layer of elastomer that aligns with and exposes the surface of said conductive layer overlying said contact pad; depositing a layer of solder or solder compound over the exposed surface of said conductive layer; and performing a process of reflow, simultaneously curing said deposited layer of solder or solder compound and said patterned and etched layer of elastomer.

20. The method of claim 18 with the additional step of performing an in-situ sputter clean of said conductive layer overlying said contact pad, said additional step to be performed after said step of patterning and etching said layer of elastomer.

21. The method of claim 18 with the additional step of depositing a seed layer over the surface of said layer of conductive material, said additional step to be performed after said layer of conductive material has been deposited.

22. The method of claim 18 with the additional step of depositing a solder flux or paste over said deposited layer of solder or solder compound, said additional step to be performed after said layer of solder or solder compound has been deposited.

23. The method of claim 18 wherein said patterning and etching said conductive layer leaving said conductive layer in place above and extending from above said contact pad by a measurable amount is further expanded to simultaneously create conductive interconnect lines on the surface of said layer of passivation, said conductive interconnect lines to make contact with at least one contact pad on said semiconductor substrate by creating openings in said layer of passivation that align with at least one contact pad on said semiconductor substrate.

24. A conductive bump overlying a layer of Under Bump Metallization (UBM) formed in electrical contact with at least one contact pad underlying at least one via defined in at least one layer of passivation deposited over a semiconductor substrate, comprising:

providing said semiconductor substrate including integrated circuitry therein, and at least one layer of passivation having a thickness deposited over the surface of said semiconductor substrate;

providing access to said integrated circuitry for external contact by forming at least one via having a diameter extending through said at least one layer of passivation, partially exposing the surface of said at least one contact pad;

performing an in-situ sputter clean of the partially exposed surface of the at least one contact pad;

forming a substantially conformal layer of UBM metal having a thickness over said at least one layer of passivation with a portion of said layer of UBM metal extending into said at least one via to make electrical contact with said at least one contact pad;

defining a partially exposed surface of said layer of UBM that is aligned with said at least one contact pad by depositing, patterning and etching a layer of etch blocking material over the surface of said semiconductor surface, removing said first layer of etch blocking material from above surface areas of said layer of UBM that do not belong to the surface of said first partially exposed surface of said layer of UBM;

etching said layer of UBM, removing said etched layer of UBM from the surface of said semiconductor surface where this layer of UBM does not belong to said first partially exposed surface of said layer of UBM, creating a partially exposed layer of UBM, partially exposing the surface of said layer of passivation;

removing said patterned and etched first layer of etch blocking material from the above the surface of said semiconductor surface;

depositing a layer of elastomer or any other suitable polymer over said partially exposed layer of UBM, thereby including the surface of said partially exposed layer of passivation;

patterning and etching said layer of elastomer or any other suitable polymer, creating at least one opening in said layer of elastomer or any other suitable polymer that aligns with and exposes the surface of said partially exposed surface of said layer of UBM;

filling said at least one opening created in said layer of elastomer or any other suitable polymer with a solder compound or its alloy;

applying a flux to the surface of said solder compound or its alloys; and reflowing the surface of said layer of solder or its alloys, forming the solder bump, while simultaneously curing said elastomer or any other suitable polymer.

25. The conductive bump of claim 24 wherein said layer of etch blocking material comprises photoresist.

26. The conductive bump of claim 24 with the additional step of plating a conductive material over the surface of said partially exposed surface of said layer of UBM, said additional step to be performed prior to said step of filling said opening created in said layer of second etch blocking material with a solder compound or its alloy.

27. The conductive bump of claim of claim 26 wherein said conductive material comprises a metal.

28. The conductive bump of claim 24 wherein said at least one layer of passivation comprises PE $Si_3N_4$ deposited to a thickness between about 200 and 800 Angstrom.

29. The conductive bump of claim 24 wherein at least one of said at least on layers of passivation is selected from the group comprising the materials PE $Si_3N_4$, $SiO_2$, a photosensitive polyimide, phosphorous doped silicon dioxide and titanium nitride deposited to a thickness between about 200 and 800 Angstrom.

30. The conductive bump of claim 24 wherein said layer of Under Bump Metallurgy comprises a layer of chromium followed by a layer of copper followed by a layer of gold.

31. The conductive bump of claim 24 wherein said layer of Under Bump Metallurgy comprises a plurality of sub-layers of different metallic composition wherein at least one of said plurality of sub-layers comprises titanium and at least one of said plurality of sub-layers comprises copper.

32. The conductive bump of claim 24 wherein said contact pad on said semiconductor surface is electrically connected with a semiconductor device with at least one conductive line of interconnect or with at least one conductive contact point.

33. The conductive bump of claim 24 wherein said etching said layer of partially exposed layer of UBM to create said first partially exposed surface of said layer of UBM comprises methods of sputter etching or wet etching.

34. The conductive bump of claim 24 wherein said surface of said semiconductor substrate is expanded to surfaces that are selected from a group of surfaces comprising semiconductor substrates, printed circuit boards, flex circuits or a metallized or glass substrate or semiconductor device mounting support.

35. The method of claim 24 with the additional step of performing an in-situ sputter clean of said conductive layer overlying said contact pad, said additional step to be performed after said step of patterning and etching said layer of elastomer.

36. The method of claim 24 with the additional step of depositing a seed layer over the surface of said substantially conformal layer of UBM, said additional step to be performed after said layer of substantially conformal layer of UBM been deposited.

37. The method of claim 24 said wherein etching said layer of UBM creating a partially exposed layer of UBM is further expanded to simultaneously create conductive interconnect lines on the surface of said on or more layers of passivation, said conductive interconnect lines to make contact with at least one contact pad on said semiconductor substrate by creating openings in said one or more layers of passivation that align with at least one contact pad on said semiconductor substrate.

* * * * *